(12) United States Patent
Chang et al.

(10) Patent No.: US 7,442,944 B2
(45) Date of Patent: Oct. 28, 2008

(54) ION BEAM IMPLANT CURRENT, SPOT WIDTH AND POSITION TUNING

(75) Inventors: Shengwu Chang, South Hamilton, MA (US); Antonella Cucchetti, Beverly, MA (US); Joseph P. Dzengeleski, Newton, NH (US); Gregory R. Gibilaro, Topsfield, MA (US); Rosario Mollica, Wilmington, MA (US); Gregg A. Norris, Rockport, MA (US); Joseph C. Olson, Beverly, MA (US); Marie J. Welsch, Georgetown, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 411 days.

(21) Appl. No.: 10/960,904

(22) Filed: Oct. 7, 2004

(65) Prior Publication Data

US 2006/0076510 A1 Apr. 13, 2006

(51) Int. Cl.
*H01J 37/317* (2006.01)

(52) U.S. Cl. .............................. 250/492.21; 250/492.2; 250/397; 250/396 R

(58) Field of Classification Search ............... 250/492.2
See application file for complete search history.

(56) References Cited

U.S. PATENT DOCUMENTS

| | | | |
|---|---|---|---|
| 4,346,301 A | 8/1982 | Robinson et al. | |
| 4,421,988 A | 12/1983 | Robertson et al. | |
| 4,922,106 A | 5/1990 | Berrian et al. | |
| 5,434,423 A | 7/1995 | Phan et al. | |
| 5,811,823 A | 9/1998 | Blake et al. | |
| 6,437,350 B1 | 8/2002 | Olson et al. | |
| 6,614,027 B1 | 9/2003 | Iwasawa | |
| 7,026,628 B2 * | 4/2006 | Krueger | 250/397 |
| 2002/0081788 A1 | 6/2002 | Cucchetti et al. | |
| 2003/0042427 A1 | 3/2003 | Sullivan | |
| 2004/0262533 A1 * | 12/2004 | Krueger | 250/397 |
| 2005/0263721 A1 * | 12/2005 | Renau et al. | 250/492.21 |
| 2006/0113489 A1 * | 6/2006 | Ray et al. | 250/492.21 |

FOREIGN PATENT DOCUMENTS

| | | |
|---|---|---|
| EP | 0473097 | 3/1992 |
| JP | H08-250062 | 9/1996 |

* cited by examiner

*Primary Examiner*—David A Vanore
*Assistant Examiner*—James J Leybourne

(57) ABSTRACT

An ion beam tuning method, system and program product for tuning an ion implanter system are disclosed. The invention obtains an ion beam profile of the ion beam by, for example, scanning the ion beam across a profiler that is within an implant chamber; and tunes the ion implanter system to maximize an estimated implant current based on the ion beam profile to simultaneously optimize total ion beam current and ion beam spot width, and maximize implant current. In addition, the tuning can also position the ion beam along a desired ion beam path based on the feedback of the spot beam center, which improves ion implanter system productivity and performance by reducing ion beam setup time and provides repeatable beam angle performance for each ion beam over many setups.

25 Claims, 8 Drawing Sheets

ION BEAM IMPLANT CURRENT, SPOT WIDTH AND POSITION TUNING

BACKGROUND OF THE INVENTION

1. Technical Field

The present invention relates generally to ion implanter systems, and more particularly, to a method, system and program product for tuning an ion implanter system to maximize ion beam implant current by using an estimated implant current, and to position the ion beam along a desired ion beam path by using a spot beam center.

2. Related Art

Ion implantation processes typically require a uniform and consistent dose or amount of ions to be implanted into a semiconductor wafer. Dose is generally a function of ion beam current density and time that the wafer spends in front of an ion beam. Referring to FIG. 1, conventional single wafer ion implanters typically provide an ion beam that is horizontally an electro-statically scanned spot beam 4. In order to scan a wafer 6, one conventional approach moves the wafer vertically (as shown by the three wafer 6 positions in FIG. 1) and ion beam 4 is swept horizontally back-and-forth across wafer 6. During this process, in order to achieve a uniform dosage, ion beam 4 has to be swept completely off the edges of wafer 6, which results in an oversweep of width d on each side of wafer 6. Since oversweep size d is proportional to ion beam 4 width D in a sweeping direction, the beam width at the wafer plane has a significant effect on the amount of beam 4 that can be used, i.e., an implant current of the beam. In particular, oversweep creates a situation in which a fraction of the entire beam is available for use, which impacts ion implanter system productivity.

In order to address this situation it is advantageous to maximize ion beam implant current, which is determined by total ion beam current and ion beam spot width. "Implant current" is the quantity of current at which the ion beam impacts the wafer, and is to be distinguished from total ion beam current, which is merely the cumulative current of the ion beam available through one sweep. Implant current is a function of total ion beam current and ion beam spot width, and increases as total ion beam current increases and ion beam spot width decreases. On the other hand, ion beam spot width is a function of total ion beam current and increases as total ion beam current increases. Accordingly, total ion beam current and ion beam spot width have to be optimized simultaneously to maximize implant current. On conventional single wafer ion implanters, however, total ion beam current tuning and beam spot width profiling are accomplished separately. In particular, the total ion beam current is tuned at a set-up Faraday cup that may be moved into and out of the path of the ion beam. Ion beam spot width is measured at a wafer plane by a traveling Faraday cup profiler, as disclosed, for example, in U.S. Pat. No. 4,922,106. The beam transmission from the set-up Faraday cup to wafer is not controlled.

One approach that considers beam width relative to controlling an ion implanter is disclosed in U.S. Pat. No. 6,614,027 to Iwasawa. Iwasawa discloses a method and apparatus capable of preventing the total ion beam current of a swept charged particle beam from becoming smaller than a prescribed value when an electrostatic lens is adjusted by having the control consider the width of the charged particle beam in a sweeping direction. Iwasawa generates a unified evaluated value, which considers beam width and current, and then controls a lens focusing voltage Vf(n) to maximize this value. In particular, maximization of the unified evaluated value is achieved by selecting a lens focusing voltage Vf(n) that increases total ion beam current and minimizes a beam width deviation from an ideal beam width. That is, Iwasawa intends to achieve the prescribed large swept total ion beam current with as little deviation in beam width as possible. In so doing, Iwasawa approximates the total ion beam current and ion beam spot width to their preferable states, but does not otherwise attempt to achieve an optimized total ion beam current and optimized ion beam spot width to maximize implant current. More specifically, it is impossible for Iwasawa to maximize implant current because it is incapable of simultaneously optimizing total ion beam current and ion beam spot width to achieve this goal.

Iwasawa is also limited in the ability to affect these parameters because it controls only the one lens. That is, more than one beam optical component in an ion implanter system must be controlled to optimize total ion beam current and ion beam spot width simultaneously to maximize implant current. As a result, Iwasawa is incapable of adequately addressing the underutilization of an ion beam caused by oversweep.

Another challenge to optimizing ion implanter productivity is to minimize beam set up time. In conventional ion implanter systems, set up requires a number of measurements and subsequent tuning steps to be conducted, such as ion beam implant current tuning as described above, parallelism tuning and uniformity tuning. The challenge is increased because it is common to repeatedly use the same group of ion beams for implanting different wafers. As a result, the same ion beams need to be set up over and over again during continuous production. It is desirable to have constant beam geometry for each ion beam over many setups to provide consistent semiconductor device performance.

In view of the foregoing, there is a need in the art for a technique to maximize ion beam implant current as well as minimize ion beam set up time and otherwise improve ion implanter system productivity.

SUMMARY OF THE INVENTION

This invention provides an ion beam tuning method, system and program product for tuning an ion implanter system. The invention obtains an ion beam profile of the ion beam by, for example, scanning the ion beam across a profiler that is within an implant chamber; and tunes the ion implanter system to maximize an estimated implant current based on the ion beam profile to simultaneously optimize total ion beam current and ion beam spot width, and maximize implant current. In addition, the tuning can also position the ion beam along a desired ion beam path, which improves ion implanter system productivity and performance by reducing ion beam setup time and provides repeatable beam angle performance for each ion beam over many setups. With specific regard to reducing ion beam setup time, the invention reduces the need for parallelism and uniformity tuning because a stored corrector magnet setting and uniformity scan waveform slope array will remain constant if ion beam spot width and spot beam center position are maintained same for each ion beam over many setups.

A first aspect of the invention is directed to a method for tuning an ion beam in an ion implanter system, the method comprising the steps of: obtaining an ion beam profile of the ion beam; and tuning the ion implanter system to maximize an estimated implant current based on feedback from the profiler to simultaneously optimize total ion beam current and ion beam spot width, and maximize implant current.

A second aspect of the invention is directed to a system for tuning an ion beam in an ion implanter system, the method comprising the steps of: means for obtaining an ion beam profile of the ion beam; and means for tuning the ion implanter system to maximize an estimated implant current based on feedback from the profiler to simultaneously optimize total ion beam current and ion beam spot width, and maximize implant current.

A third aspect of the invention is directed to a computer program product comprising a computer useable medium having computer readable program code embodied therein for tuning an ion beam in an ion implanter system, the program product comprising: program code configured to obtain an ion beam profile of the ion beam; and program code configured to tune the ion implanter system to maximize an estimated implant current based on feedback from the profiler to simultaneously optimize total ion beam current and ion beam spot width, and maximize implant current.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

Ion Implanter System Overview

Figure 1:
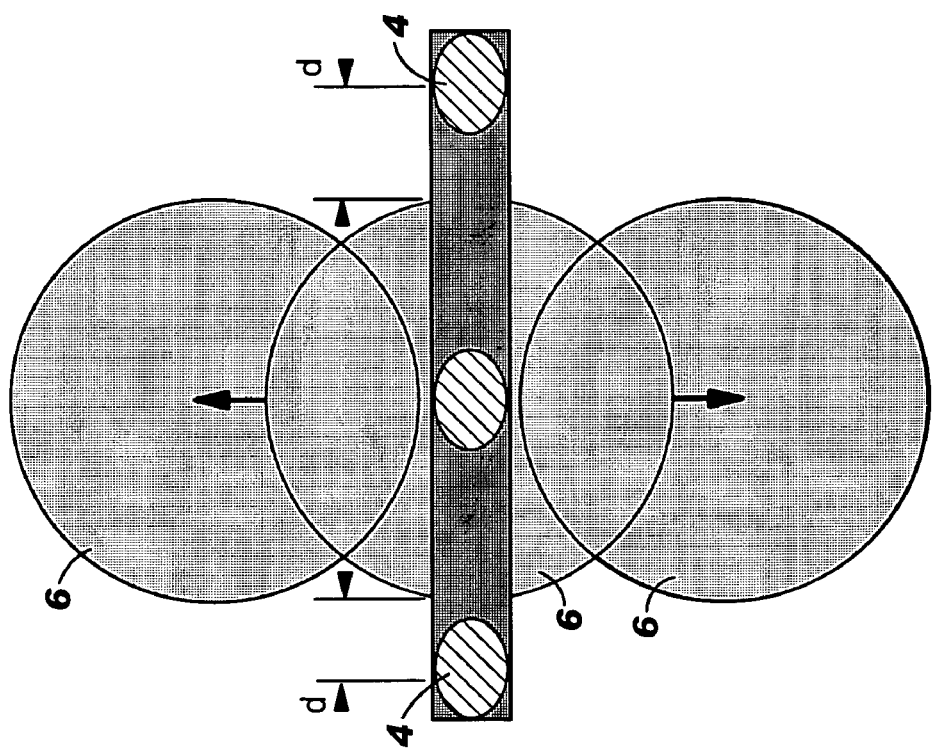
FIG. 1 shows movement of an ion beam relative to movement of a wafer in a conventional ion implanter system.
Figure 2A:
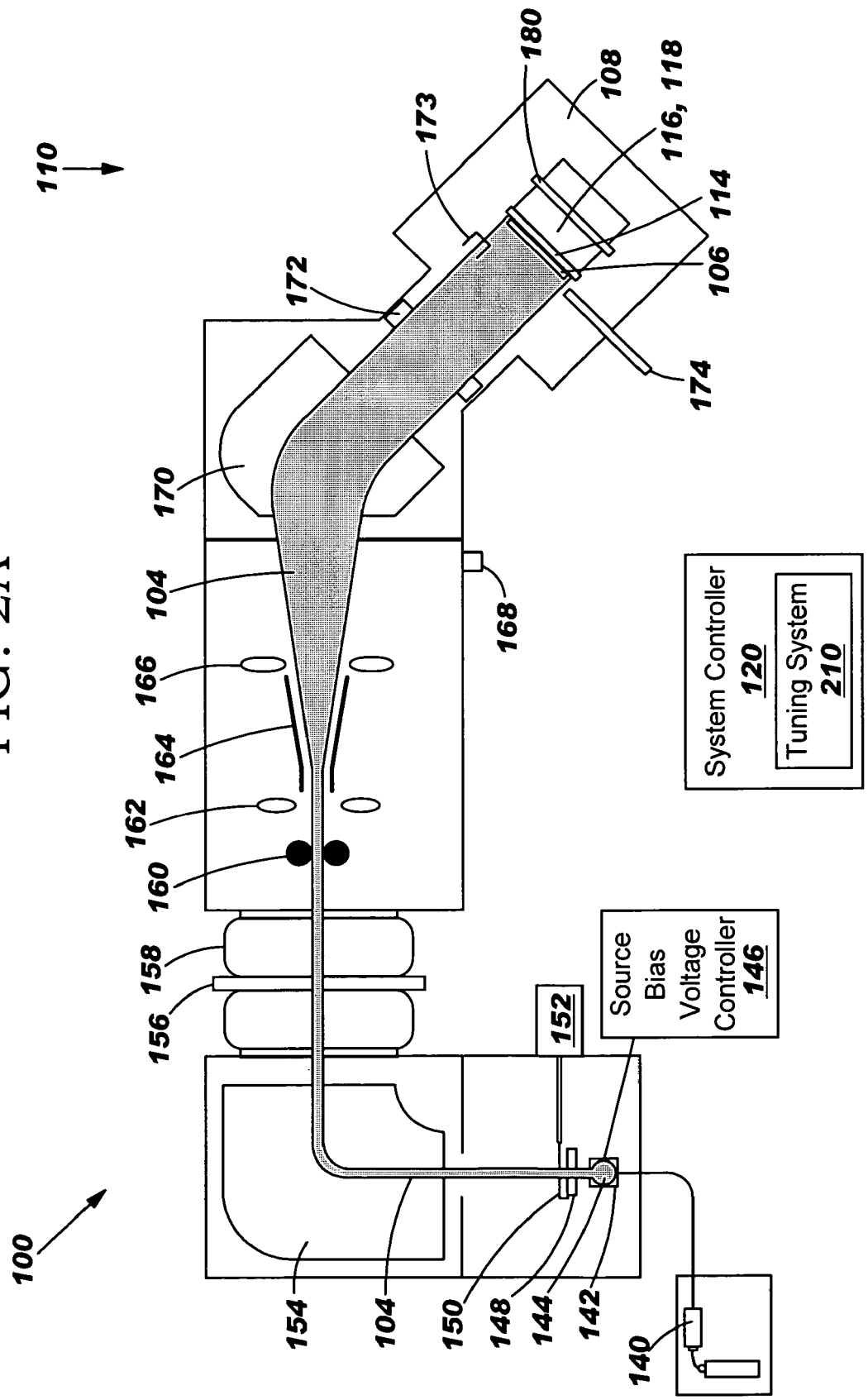
FIG. 2A shows a first embodiment of an ion implanter system including a tuning system for implant current and spot beam position according to the invention.

With reference to the accompanying drawings, FIG. 2A illustrates a first embodiment of an ion implanter system 100 according to the present invention. Implanter system 100 includes an ion beam generator 102 for generating and transmitting an ion beam 104 to a target 106 in an implant chamber 108. Ion beam generator 102 may be any now known or later developed ion beam generator such as those available from Varian Semiconductor Equipment Associates. Typically, target 106 includes one or more semiconductor wafers mounted to a holder 114. Characteristics of target 106 may be controlled by a holder drive assembly 116 that rotates the target 106, i.e., wafer, and a target vertical scan system position controller 118 that controls the vertical position of target 106. Drive assembly 116 and position controller 118 are both responsive to a system controller 120.

Besides the above-described components, ion beam generator 102 may include a gas flow 140; an ion source 142 including a source magnet 144 and a source bias voltage controller 146; a suppression electrode 148, an extraction electrode 150 and one or more manipulator motors 152 for electrodes 148, 150; an analyzer magnet 154; an accelerator focus electrode 156; an accelerator suppression electrode 158; a mass slit 160; a pre-scan suppression electrode 162; horizontal scan plates 164; a post-scan suppression electrode 166; a nitrogen ($N_2$) bleed 168; a corrector magnet 170; a limiting aperture 172. Ion implanter system 100 may further include a dose control Faraday cup 173, a profiler 174 and a sampling Faraday cup array 180. Profiler 174 includes one or more traveling Faraday cups for determining an ion beam profile, i.e., beam current density versus beam position. Although not shown for clarity sake, each of the above-described components is monitored by and responsive to system controller 120.

Figure 2B:
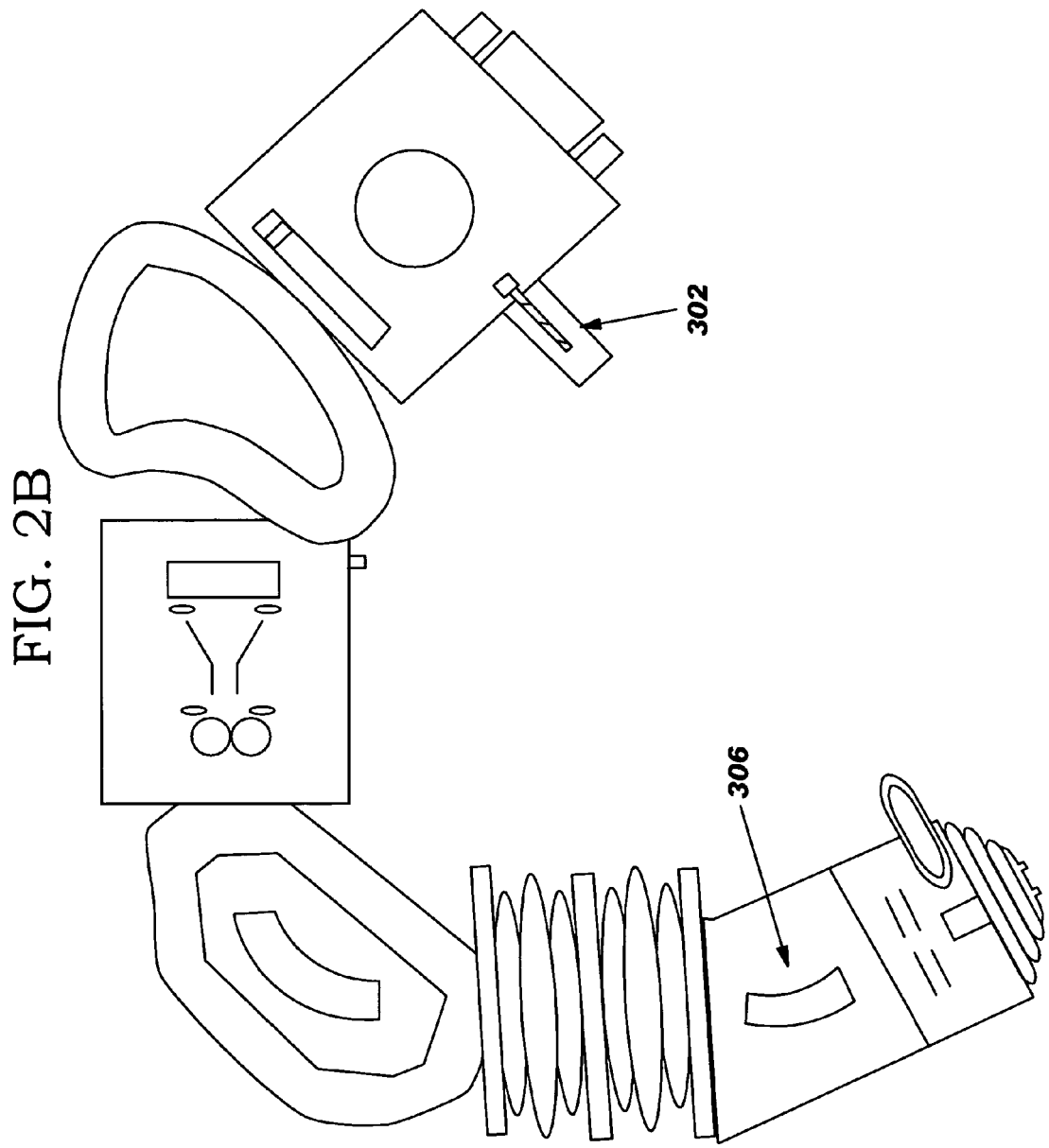
FIGS. 2B-2C show alternative embodiments of an ion implanter system including a tuning system for implant current and spot beam position according to the invention.
Figure 2C:
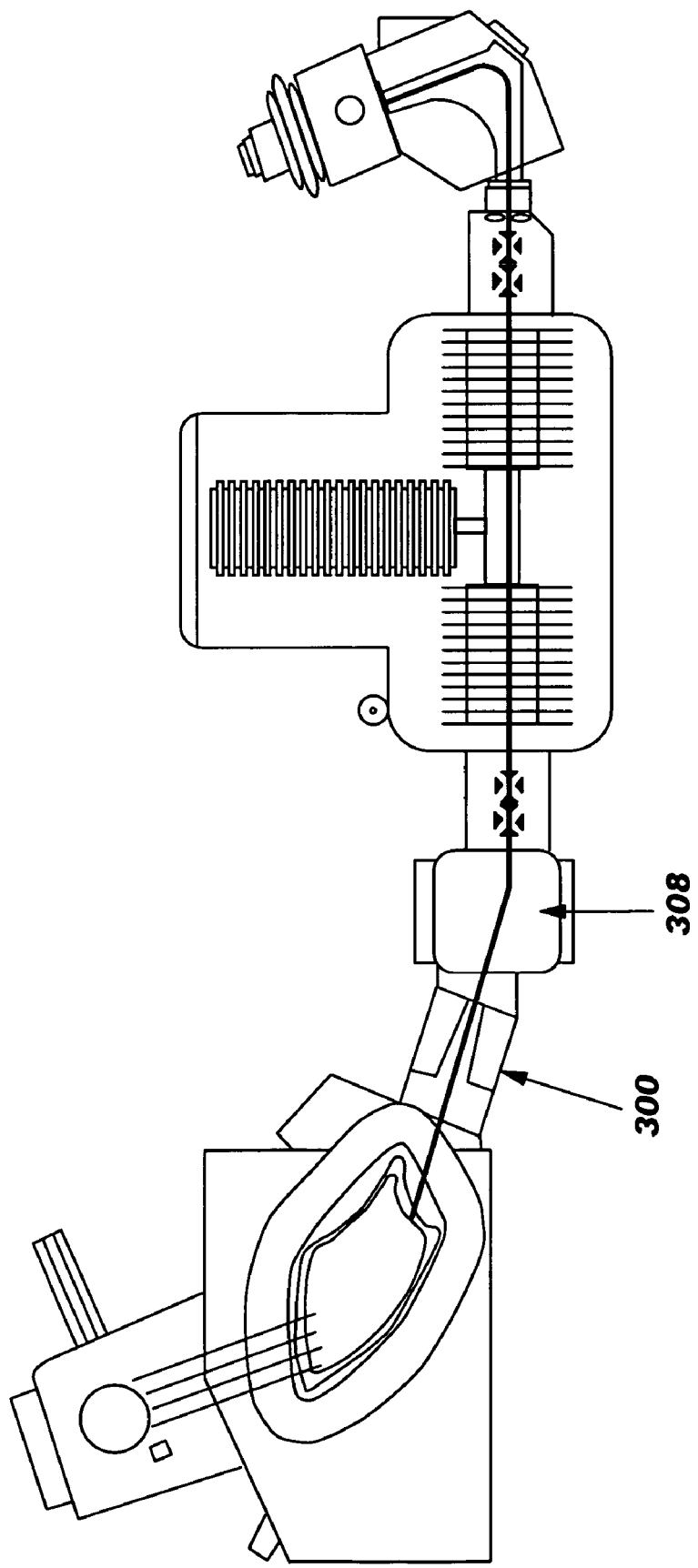

FIG. 2B shows a second embodiment of an ion implanter system including, inter alia, a moving Faraday cup 302 and a pre-analyzing magnet 306, and FIG. 2C shows a third embodiment of an ion implanter system including, inter alia, a magnetic scanner 300 and a charge-selecting magnet 308. Otherwise, the other ion implanter systems of FIGS. 2B-2C are similar to ion implanter system 100 of FIG. 2A, at least as is relevant to the present application.

The description that follows shall make reference to FIG. 2A only unless otherwise necessary. It should be understood, however, that the teachings of the invention are applicable to any ion implanter system.

Tuning System

Figure 3:
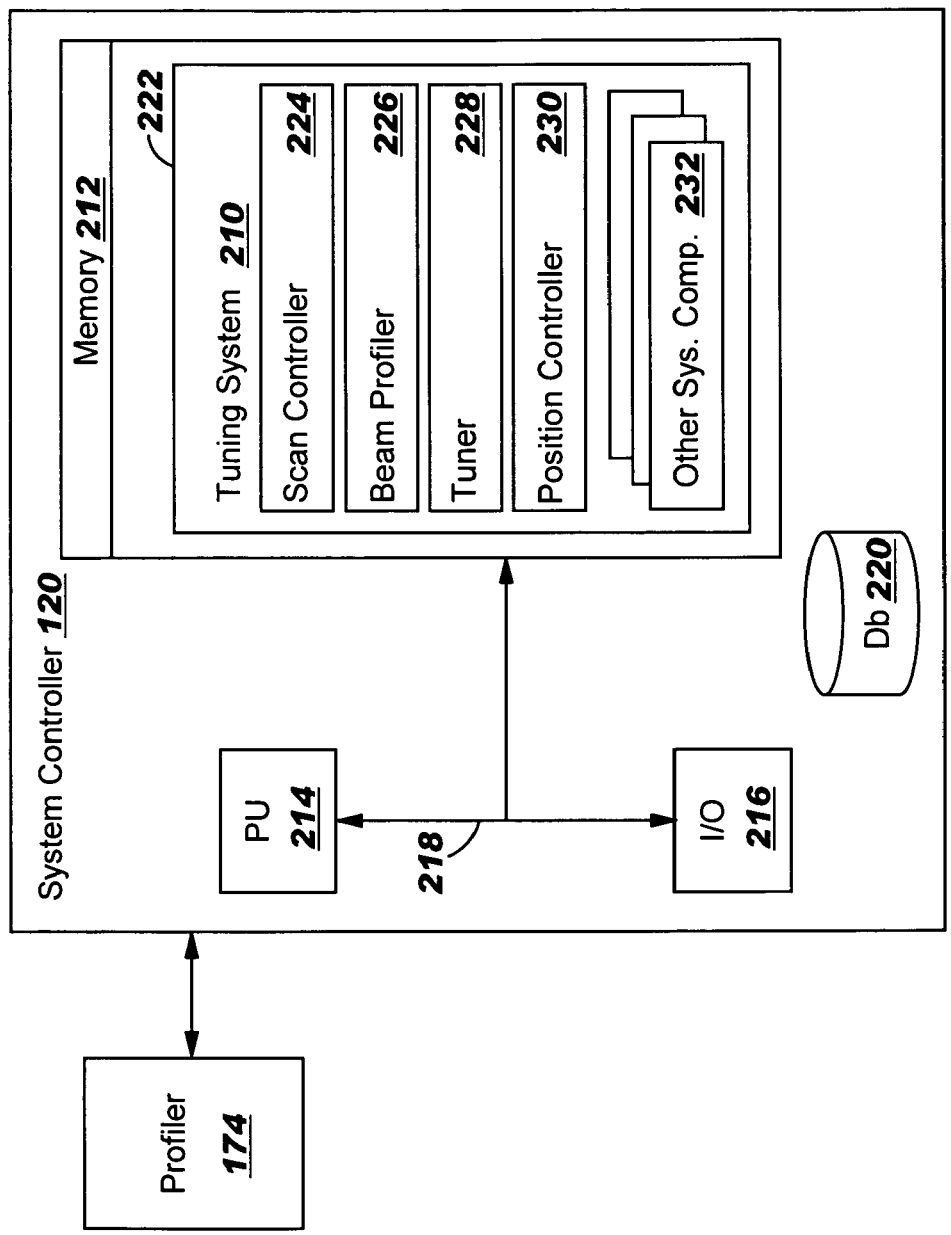
FIG. 3 shows a block diagram of the tuning system of FIGS. 2A-2C.

With reference to the accompanying drawings, FIG. 3 is a block diagram of a system controller 120 including a tuning system 210 for tuning an ion beam in ion implanter system 100 in accordance with the invention. Tuning system 210 may be incorporated as part of system controller 120 (FIG. 2A) of ion implanter system 100 (FIG. 2A) or be provided as a separate system. If a separate system, tuning system 210 includes a memory 212, a processing unit (PU) 214, input/output devices (I/O) 216 and a bus 218. A database 220 may also be provided for storage of data relative to processing tasks. Memory 212 includes a program product 222 that, when executed by PU 214, comprises various functional capabilities described in further detail below. Memory 212 (and database 220) may comprise any known type of data storage system and/or transmission media, including magnetic media, optical media, random access memory (RAM), read only memory (ROM), a data object, etc. Moreover, memory 212 (and database 220) may reside at a single physical location comprising one or more types of data storage, or be distributed across a plurality of physical systems. PU 214 may likewise comprise a single processing unit, or a plurality of processing units distributed across one or more locations. I/O 216 may comprise any known type of input/output device including a network system, modem, keyboard, mouse, scanner, voice recognition system, CRT, printer, disc drives, etc. Additional components, such as cache memory, communication systems, system software, etc., may also be incorporated into system 10.

As shown in FIG. 3, program product 222 may include a scan controller 224, a beam profiler 226, a tuner 228, a position controller 230 and other system components 232. Other system components 232 include any function necessary to tuning system 210 operation no otherwise explicitly described herein, e.g., communications protocols, etc.

Figure 4:
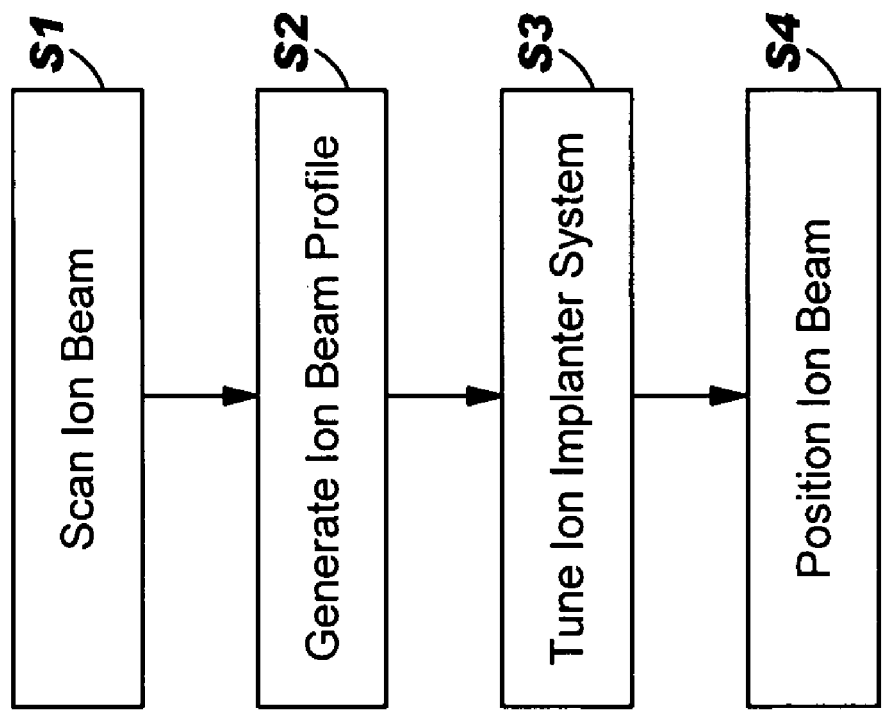
FIG. 4 shows a flow diagram of operation of the tuning system of FIGS. 2A-2C.

Turning to FIG. 4, in conjunction with FIGS. 2A and 3, a flow diagram of operational methodology according to one embodiment of the invention will now be described.

Figure 5:
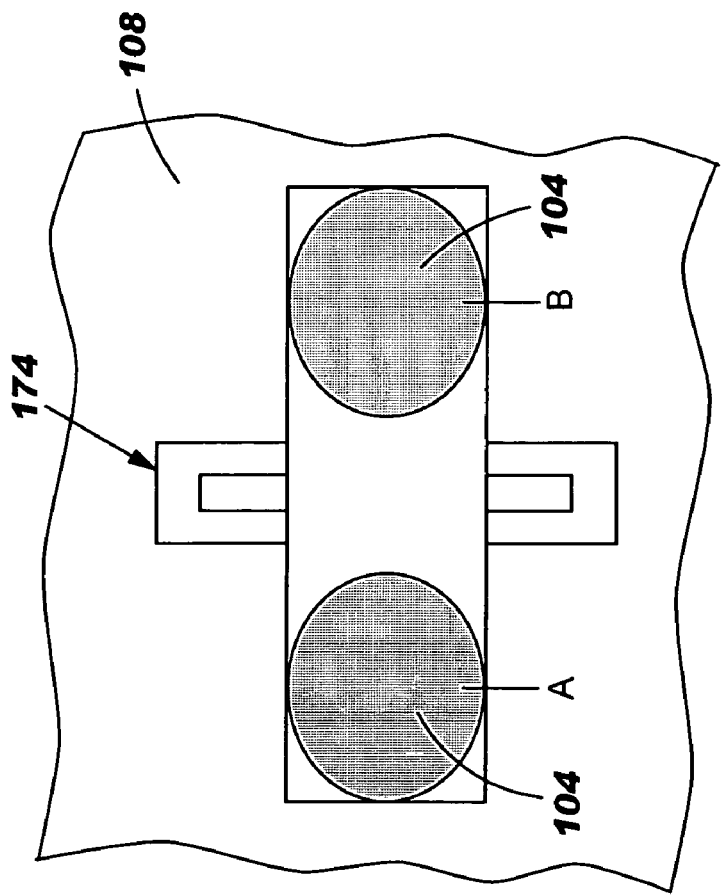
FIG. 5 shows a scanning of an ion beam according to the invention.

Steps S1-S2 represent a step of obtaining an ion beam profile. In first step S1, in one embodiment, ion beam 104 is scanned across profiler 174 that is within implant chamber 108 under the control of scan controller 224. In one embodiment, the scan occurs relatively slowly, for example, at approximately 100 Hz. As shown in FIG. 5, profiler 174 is positioned in substantially a center of implant chamber 108 by scan controller 224. A beam scanner under the control of scan controller 224 is calibrated to position ion beam 104 to intersect profiler 174. Instead of profiler 174, one or more sampling cups in sampling Faraday cups array 180 may be used. A beam scanner can be any ion implanter system 100 element(s) capable of scanning ion beam 104. In one embodiment, the beam canner can be one of horizontal scan plates 164 and corrector magnet 170 (at a lower frequency) of ion implanter system 100. In those ion implanter systems that include a magnetic scanner 300 (FIG. 2C), that scanner may be used. In an alternative embodiment, those ion implanter systems that include movable Faraday cups 302 (FIG. 2B), the movable Faraday cups 302 may be used. That is, the profiler may be moved across ion beam 104, rather than moving ion beam 104.

Figure 6:
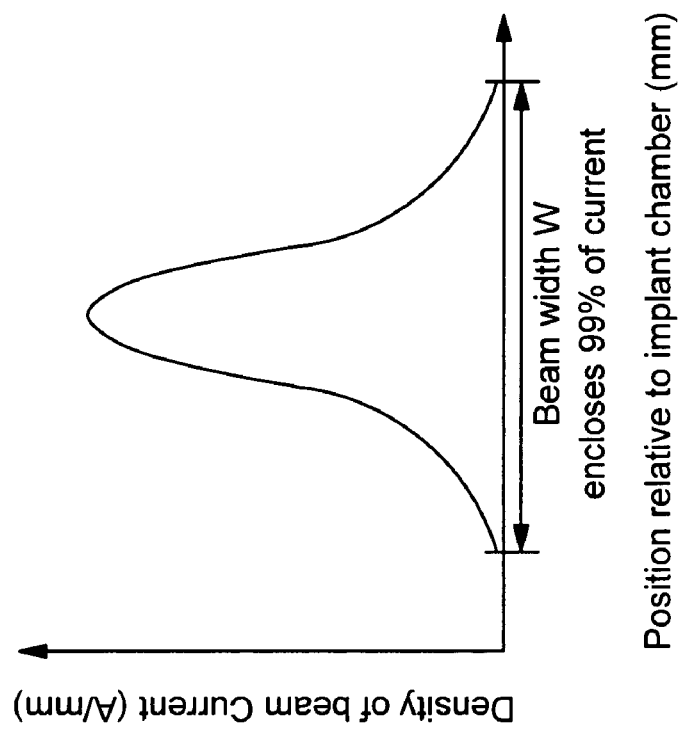
FIG. 6 shows an ion beam profile used by the tuning system of FIGS. 2A-2C.

In step S2, based on feedback from profiler 174, an ion beam profile can be determined by beam profiler 226. As shown in FIG. 6, an ion beam profile includes an ion beam current density (A/mm) versus position relative to implant chamber 108. It should be recognized that density is measured in units of length, rather than area, because the measurement is made across a width interval of ion beam 104 spot. The profile shown in FIG. 6 also indicates ion beam spot width in terms of width W. While one embodiment for obtaining an ion beam profile has been described above, it should be recognized that other techniques are possible. For example, a profiler need not be positioned within the implant chamber.

Figure 7:
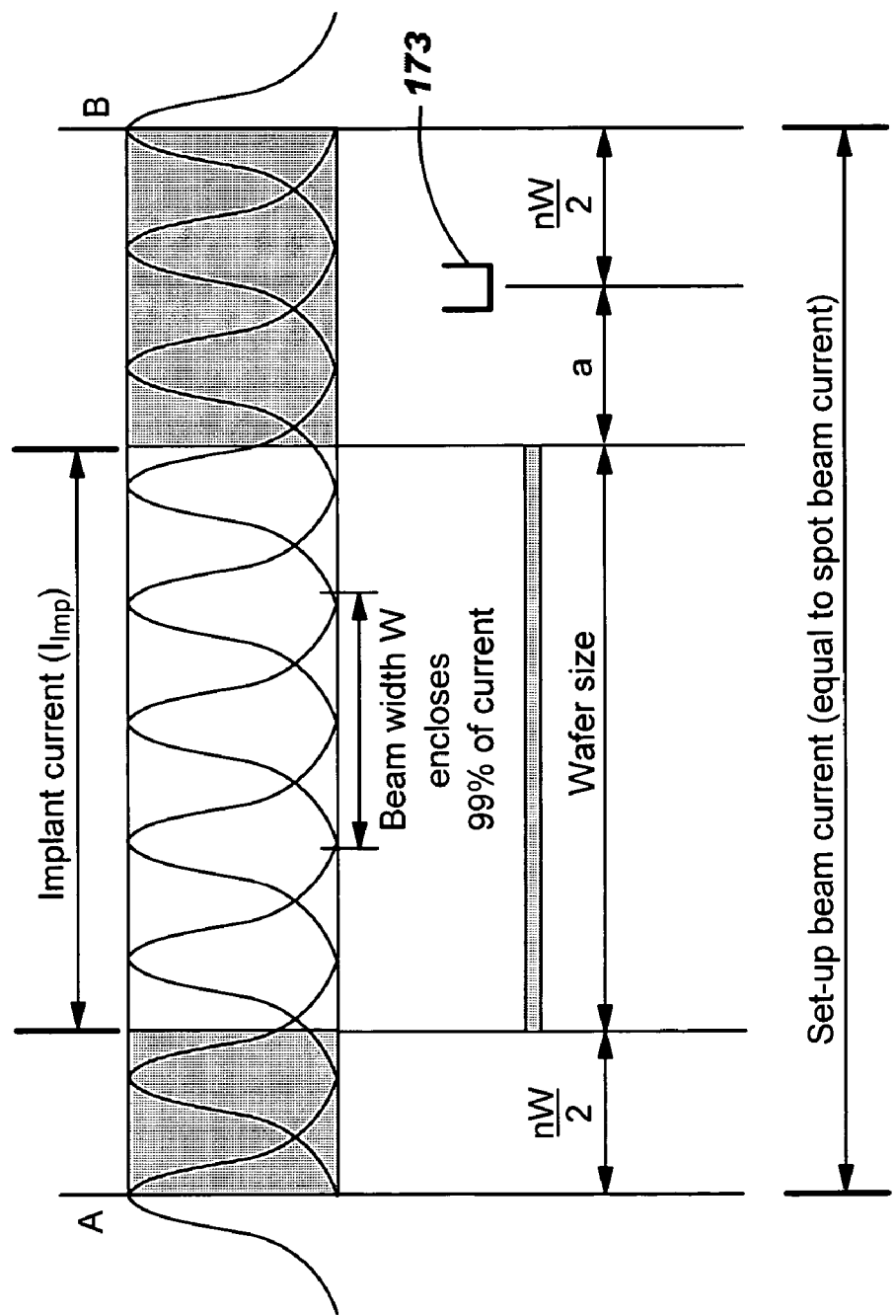
FIG. 7 shows a schematic of an ion beam pathway in an ion implanter system.

With continuing reference to FIG. 6., an area under the profile indicates "total ion beam current," which is the total current available during a sweep of ion beam 104, i.e., as shown in FIG. 7, from a fully swept position A to a second fully swept position B. "Implant current" ($I_{imp}$) is the amount of the total ion beam current available for implanting target 106 (FIG. 2A), i.e., an amount that impacts target 106. Beam profiler 226 is also configured to determine an estimated implant current based on the ion beam profile according to the following equation:

$$I_{est} = \frac{I_{beam} \times tar_{width}}{tar_{width} + (m+n)W/2 + a}$$

where $I_{est}$ is the estimated implant current (A), $I_{beam}$ is the total ion beam current (A), $tar_{width}$ is target (wafer) width (mm) exposed to the ion beam, m and n are constants, a is a distance between the target (wafer) to dose control Faraday cup 173, and W is the spot beam width. In addition, beam profiler 226 is configured to determine a spot beam center based on the ion beam profile. In particular, the spot beam center is determined by the horizontal geometry center of the area under the ion beam profile.

Returning to FIG. 4, in a second step S3, ion implanter system 100 is tuned by tuner 228 to maximize estimated implant current Iest based on feedback from the profiler 174. That is, estimated implant current $I_{est}$ is used as a closed control loop feedback of implant current to tune ion implant system 100. Maximization of the estimated implant current $I_{est}$ results in simultaneously optimization of total ion beam current $I_{beam}$ and ion beam spot width W, and maximization of implant current $I_{imp}$. In one embodiment, feedback includes an estimated implant current and the spot beam center, as determined in step S2. Tuning then includes maximizing the estimate implant current $I_{est}$. It should be recognized, however, that other feedback from profiler 174 such as total beam current $I_{beam}$ and ion beam spot width W may also be used to tune ion implanter system 100.

Actual tuning of ion implanter system 100 includes adjusting practically any system element including at least one of: a gas flow 140; an ion source 142 including a source magnet 144 and a source bias voltage (via controller 146); a suppression electrode 148, an extraction electrode 150 and one or more manipulator motors 152 for electrodes 148, 150; an analyzer magnet 154; an accelerator focus electrode 156; an accelerator suppression electrode 158; a mass slit 160; a pre-scan suppression electrode 162; horizontal scan plates 164; a post-scan suppression electrode 166; a nitrogen ($N_2$) bleed 168; a corrector magnet 170; a limiting aperture 172. In those ion implanter systems that include pre-analyzing magnet 306 (FIG. 2B) and/or charge-selecting magnet 308 (FIG. 2C), adjustment of that pre-analyzing magnet 306 (FIG. 2B) and/or charge-selecting magnet 308(FIG. 2C) may also be included. The object of the tuning is to maximize estimated implant current $I_{est}$, which results in optimizing ion beam current $I_{beam}$ and ion beam spot width W simultaneously to achieve maximum implant current $I_{imp}$.

In an optional fourth step S4, position controller 228 of tuning system 210 also controls tuning to position the ion beam along the desired ion beam path based on the feedback of the spot beam center from the profiler 174. The position tuning includes utilizing the feedback of the spot beam center to determine the position of an ion beam with respect to the desired ion beam path. The position tuning then further includes adjusting ion implanter system 100 elements for a desired feedback of the spot beam center and positioning the ion beam along the desired ion beam path based on the feedback of the spot beam center. As a result, the ion beam spot width and the spot beam center are maintained for each beam over many setups. In this regard, tuning improves ion implanter system 100 productivity and performance by reducing ion beam setup time and provides repeatable beam angle performance for each ion beam over many setups. In terms of tuning to position the ion beam along a desired ion beam path during the above-described tuning method to maximize estimated implant current, adjustment of at least one of limiting aperture 172, (rotary) mass slit 160, manipulator 152, source magnet 144 and analyzer magnet 154 can be implemented to position the ion beam along the desired ion beam path. In addition, in those ion implanter systems that include a pre-analyzing magnet 306 (FIG. 2B) and/or a charge-selecting magnet 308 (FIG. 2C), adjustment of that pre-analyzing magnet 306 (FIG. 2B) and/or charge-selecting magnet 308 (FIG. 2C) may also be implemented to position the ion beam along the desired ion beam path. Once these settings are known for a particular arrangement of a characteristic of an ion beam and parameters of implanter system 100 elements, the settings can be recalled to repeat the arrangement.

The above-described invention accomplishes beam tuning with achievement of maximum implant current, which improves productivity of single wafer implanters. The invention also accomplishes beam tuning with positioning of the ion beam along the desired ion beam path, which improves ion implanter system productivity and performance by reducing ion beam setup time and providing repeatable beam angle performance since the ion beam spot width and the spot beam center are maintained for each ion beam over many setups.

CONCLUSION

In the previous discussion, it will be understood that the method steps discussed are performed by a processor, such as PU 14 of system 10, executing instructions of program product 22 stored in memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method for tuning an ion beam in an ion implanter system, the method comprising the steps of:
   obtaining an ion beam profile of the ion beam; and
   tuning the ion implanter system to maximize an estimated implant current based on the ion beam profile to simultaneously optimize total ion beam current and ion beam spot width, and maximize implant current.

2. The method of claim 1, further comprising the steps of:
   estimating the implant current based on the ion beam profile; and
   determining the ion beam spot width and a spot beam center based on the ion beam profile.

3. The method of claim 2, wherein the tuning step further includes adjusting implanter system elements including at least one of a limiting aperture, a mass slit, a manipulator, a source magnet, a pre-analyzing magnet, a charge-selecting magnet and an analyzer magnet to position the ion beam along a desired ion beam path based on the feedback of the spot beam center.

4. The method of claim 1, wherein the estimated implant current is determined according to:

$$I_{est} = \frac{I_{beam} \times tar_{width}}{tar_{width} + (m+n)W/2 + a}$$

where $I_{est}$ is estimated implant current, $I_{beam}$ is the total ion beam current, $tar_{width}$ is the target width exposed to the ion beam, m and n are constants, a is a distance the target is to a dose control Faraday cup, and W is the ion beam spot width.

5. The method of claim 1, wherein the tuning step includes adjusting at least one of: a gas flow; an ion source; a source magnet; a source bias voltage; a suppression electrode; an extraction electrode; a manipulator motor; a pre-analyzing magnet; a charge-selecting magnet; an analyzer magnet; an accelerator focus electrode; an accelerator suppression electrode; a mass slit; a pre-scan suppression electrode; horizontal scan plates; a post-scan suppression electrode; a nitrogen ($N_2$) bleed; a corrector magnet; a limiting aperture of the ion implanter system.

6. The method of claim 1, wherein the obtaining step includes scanning the ion beam across a profiler that is within an implant chamber.

7. The method of claim 6, wherein the scanning step includes using a beam scanner to scan the ion beam, the beam scanner selected from one of horizontal scan plates, a corrector magnet and a magnetic scanner of the ion implanter system.

8. The method of claim 7, further comprising the step of calibrating the beam scanner to position the ion beam to intersect the profiler.

9. The method of claim 1, wherein the scanning step includes positioning the profiler in substantially a center of the implant chamber.

10. The method of claim 1, wherein the profiler includes a Faraday cup.

11. A system for tuning an ion beam in an ion implanter system, the system comprising:
    means for obtaining an ion beam profile of the ion beam; and
    means for tuning the ion implanter system to maximize an estimated implant current based on the ion beam profile to simultaneously optimize total ion beam current and ion beam spot width, and maximize implant current.

12. The system of claim 11, wherein the profiling means further functions to:
    determine an ion beam profile,
    estimate the implant current based on the ion beam profile, and
    determine the ion beam spot width and a spot beam center based on the ion beam profile.

13. The system of claim 11, wherein the tuning means further includes means for adjusting implanter system elements including at least one of a limiting aperture, a mass slit, a manipulator, a source magnet, a pre-analyzing magnet, a charge-selecting magnet and an analyzer magnet to position the ion beam along a desired ion beam path based on the feedback of the spot beam center.

14. The system of claim 11, wherein the estimated implant current is determined according to:

$$I_{est} = \frac{I_{beam} \times tar_{width}}{tar_{width} + (m+n)W/2 + a}$$

where $I_{est}$ is estimated implant current, $I_{beam}$ is the total ion beam current, $tar_{width}$ is the target width exposed to the ion beam, m and n are constants, a is a distance the target is to a dose control Faraday cup, and W is the ion beam spot width.

15. The system of claim 11, wherein the obtaining means includes means for controlling scanning of an ion beam across a means for profiling that is within an implant chamber.

16. The system of claim 15, wherein the profiling means is positioned substantially at a center of the implant chamber.

17. A computer program product comprising a computer useable medium having computer readable program code embodied therein for tuning an ion beam in an ion implanter system, the program product comprising:
    program code configured to obtain an ion beam profile of the ion beam; and program code configured to tune the ion implanter system to maximize an estimated implant current based on the ion beam profile to simultaneously optimize total ion beam current and ion beam spot width, and maximize implant current.

18. The program product of claim 17, wherein feedback includes an ion beam profile, and further comprising program code configured to estimate the implant current based on the ion beam profile; and program code configured to determine the ion beam spot width and the spot beam center based on the ion beam profile.

19. The program product of claim 18, further comprising the program code configured to adjust implanter system elements including at least one of a limiting aperture, a mass slit, a manipulator, a source magnet, a pre-analyzing magnet, a charge-selecting magnet and an analyzer magnet to position the ion beam along a desired ion beam path based on the feedback of the spot beam center.

20. The program product of claim 17, wherein the estimated implant current is determined according to:

$$I_{est} = \frac{I_{beam} \times tar_{width}}{tar_{width} + (m+n)W/2 + a}$$

where $I_{est}$ is estimated implant current, $I_{beam}$ is the total ion beam current, $tar_{width}$ is the target width exposed to the ion beam, m and n are constants, a is a distance the target is to a dose control Faraday cup, and W is the ion beam spot width.

21. The program product of claim 17, wherein the tuning program code adjusts at least one of: a gas flow; an ion source; a source magnet; a source bias voltage; a suppression electrode; an extraction electrode; a manipulator motor; a pre-analyzing magnet; a charge-selecting magnet; an analyzer magnet; an accelerator focus electrode; an accelerator suppression electrode; a mass slit; a pre-scan suppression electrode; horizontal scan plates; a post-scan suppression electrode; a nitrogen ($N_2$) bleed; a corrector magnet; a limiting aperture of the ion implanter system.

22. The program product of claim 17, wherein the obtaining program code includes program code configured to control scanning of the ion beam across a profiler that is within an implant chamber.

23. The program product of claim 22, wherein the scanning control program code controls a beam scanner to scan the ion beam, the beam scanner selected from one of horizontal scan plates, a corrector magnet and a magnetic scanner of the ion implanter system.

24. The program product of claim 23, further comprising the program code configured to calibrate the beam scanner to position the ion beam to intersect the profiler.

25. The program product of claim 22, wherein the scanning control program code positions the profiler in substantially a center of the implant chamber.

* * * * *